United States Patent [19]

Lien

[11] Patent Number: 5,401,997
[45] Date of Patent: Mar. 28, 1995

[54] ESD PROTECTION FOR POLY RESISTOR ON OXIDE

[75] Inventor: Chuen-Der Lien, Mountain View, Calif.

[73] Assignee: Integrated Device Technology, Inc., Santa Clara, Calif.

[21] Appl. No.: 823,764

[22] Filed: Jan. 22, 1992

[51] Int. Cl.6 .............................................. H01L 33/00
[52] U.S. Cl. .................................... 257/347; 257/355
[58] Field of Search ................... 357/23.13; 257/367, 257/355

[56] References Cited

U.S. PATENT DOCUMENTS

| | | | |
|---|---|---|---|
| 4,697,199 | 9/1987 | De Graaff et al. | 357/23.13 |
| 4,730,208 | 3/1988 | Sugino et al. | 357/23.8 |
| 4,733,285 | 3/1988 | Ishioka et al. | 357/23.13 |
| 4,760,434 | 7/1988 | Tsuzuki et al. | 357/23.13 |
| 4,858,055 | 8/1989 | Okitaka | 361/91 |
| 4,937,639 | 6/1990 | Yao et al. | 357/23.13 |
| 5,017,985 | 5/1991 | Lin | 357/23.13 |

OTHER PUBLICATIONS

"A CMOS VLSI ESD Input Protection Device, DI-FIDW," Chong Ming Lin, et al., Electrical Overstress-/Electrostatic Discharge Symposium Proceedings, 1984, pp. 202–209.

*Primary Examiner*—Andrew J. James
*Assistant Examiner*—Stephen D. Meier

[57] ABSTRACT

An improved Electrostatic Discharge (ESD) protection device for use in the electrostatic discharge testing of an integrated circuit (IC). In accordance with the invention, a p-n junction is formed beneath a polysilicon resistor, with a metal oxide layer separating the resistor and the p-n junction. The p-n junction is formed by positioning a semiconductor well having a first polarity between the metal oxide and a semiconductor substrate having a second polarity. The invention reduces the electrostatic potential across the metal oxide layer, which could otherwise result in damage to the metal oxide during ESD testing of the IC. In a preferred embodiment, the invention includes a switch, such as a transistor, between the well and ground, for allowing the well to float freely during normal circuit operation (to reduce noise) and for fixing the well at a fixed potential during ESD testing.

12 Claims, 2 Drawing Sheets

ESD PROTECTION FOR POLY RESISTOR ON OXIDE

FIELD OF THE INVENTION

This invention relates to the field of devices and methods intended for the protection of integrated circuits (IC's) from electrostatic discharge (ESD) damage during normal operation and ESD testing.

BACKGROUND OF THE INVENTION

IC's, also known as chips, may be made more powerful if the number of devices on each chip can be increased. Increasing the level of device integration on a chip is useful only if the performance characteristics of the devices scale as the physical scale of the devices themselves is reduced. To the extent this is true, chips may be made using very large scale integration (VLSI) techniques preserving the important performance characteristics of the devices included in the network.

Where the device characteristics are faithfully preserved the increased device density leads to improved performance. However, the improvement in chip performance may be mitigated by the reality that certain other device characteristics do not scale with the physical dimensions of the chip.

Among these non-scaling factors is the ability of the chip- its input/output pad, gate oxide and dielectric substrate material- to withstand high energy ESD events during shipping and handling. Scaling down of the device size necessarily results in the use of thinner gate oxides and shallower junctions beneath the oxide. In addition, the radius of curvature of the junction may decrease as well. The smaller radius of curvature may result in increased electrostatic potentials being generated between the oxide and the substrate during ESD stress. As a consequence, the electrostatic potential does not scale with the junction depth and the oxide thickness.

Increasing integration, therefore, increases chip vulnerability to ESD failure. Wafer probing and wire bonding leave the I/O pad surface punched through with holes and create microscopic cracks in the dielectric substrate itself. When the chip experiences a high voltage ESD, these holes and micro cracks may generate strong electric fields. If the ESD energy cannot be quickly dissipated through the power lines or the substrate, the oxide beneath the pad may rupture. The rupture of the pad may provide leakage paths from the pad to the substrate hastening failure of the chip.

Since ESD can damage an IC during handling, it is conventional to connect an ESD protection device to the I/O pad (such as I/O pad 10 of FIG. 1). Sometimes a polysilicon (poly) resistor 20 is connected between the I/O pad 10 and the ESD protection device 30 as shown in FIG. 1. Typically, the poly resistor 20 is placed on top of an oxide layer which grows on the semiconductor substrate. For the input pad, this resistor can limit the input injection current when the input voltage is lower than the ground potential or higher than $V_{cc}$, the external power supply voltage. For the output, the resistor may be used for resistance matching. However, during ESD testing the oxide may become damaged precisely because of the presence of the poly resistor.

Consequently, it would be desirable to reduce the electrostatic potential across the oxide adjacent PATENT the poly resistor. It is the object of this invention to reduce this electrostatic potential without eliminating the otherwise useful poly resistor from the ESD protection network. This is accomplished by connecting a substrate well to a fixed potential during normal operation of the chip. However, when the chip is not in normal operation or is being handled, the substrate well is allowed to float.

SUMMARY OF THE INVENTION

The invention exploits the electric properties of semiconductive substrate material used in an integrated circuit, and the flat geometry of metal oxide layer deposited on such substrate material, to reduce the electrostatic potential across a metal oxide region adjacent a poly resistor.

Since the oxide has a flat geometry, surface charges generate an electrostatic potential that is directly proportional to the distance from the oxide layer surface. A well made of semiconducting material (having polarity opposite to that of the substrate material which supports it) is formed beneath the oxide region adjacent the poly resistor, and is polarized by the electrostatic field associated with surface charge potential. As a result, the electrostatic potential is reduced in the oxide layer adjacent the well.

A p-n junction is formed at the boundary between the well and the substrate on which it is supported, since the well and the substrate are made of semiconducting materials having different majority carriers. The boundary of the well is polarized by the field in the metal oxide and collects charges of the same polarity as those at the surface of the metal oxide. The substrate experiences a depletion of these carriers, which further reduces the potential across the p-n junction due to the oxide layer's electric field.

In order to maximize protection of the oxide adjacent the poly resistor, the well is floating during ESD testing of the IC. However, the well is kept at a fixed potential during normal operation of the IC to avoid any noise problem during operation.

DETAILED DESCRIPTION OF THE PREFERRED EMBODIMENT

Figure 1:
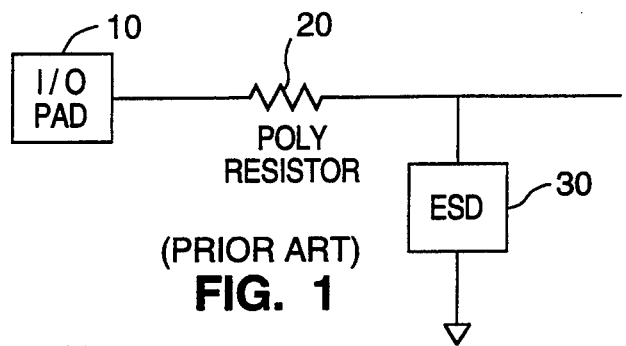
FIG. 1 is a schematic diagram of a conventional ESD protection device.
Figure 2:
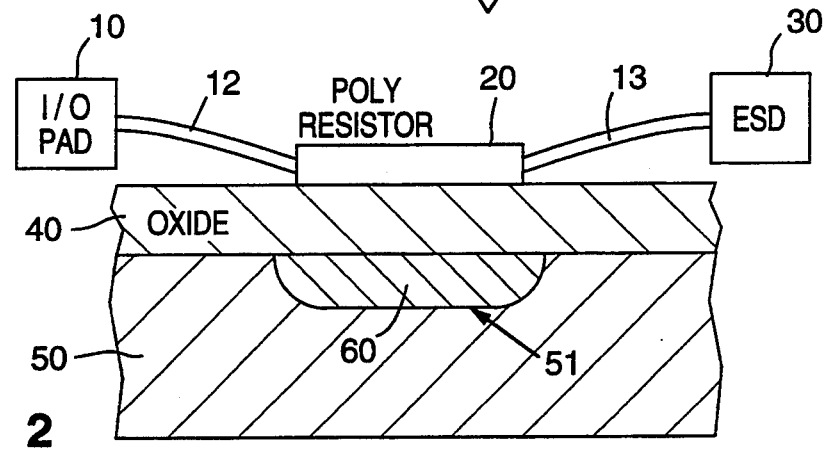
FIG. 2 is a simplified cross-sectional view, showing the relationship of the elements in the diagram of FIG. 1 with the addition of the p-n junction of the invention.

In FIG. 2, well 60 fills a cavity 51 between the IC substrate 50 and a metal oxide layer 40 on substrate 50. A polysilicon resistor 20 is formed on oxide layer 40 opposite cavity 51 and is separated from the cavity 51 by the oxide 40. Resistor 20 is connected to I/O pad 10 and ESD protection device 30 by means of wires 12 and 13, respectively. Use of a substrate well to protect an I/O pad 10 is known in the art. The present invention employs a substrate well 60 to protect metal oxide 40 (adjacent poly resistor 20) from ESD damage due to the presence of the poly resistor 20.

The substrate well 60 in cavity 51 serves to reduce the electrostatic potential across the metal oxide 40. The dielectric properties of the substrate material 60 result in a decrease of electrostatic potential at the boundary between the oxide 40 and the substrate well 60. This reduction in potential results from the fact that the metal oxide layer 40 has a substantially flat geometry. The potential associated with such a geometry is directly proportional to the distance from the source. Since well 60 also has a flat geometry at this boundary and charge carriers of opposite polarity will migrate to the flat upper surface of the well 60, the potential across the metal oxide layer 40 is reduced.

At the boundary between the well 60 and the substrate 50 a p-n junction is formed. This junction contributes to a drop in electrostatic potential between well 60 and substrate 50, which are regions of opposite polarity. As a result, the electrostatic potential across the metal oxide 40 is further decreased.

Figure 3:
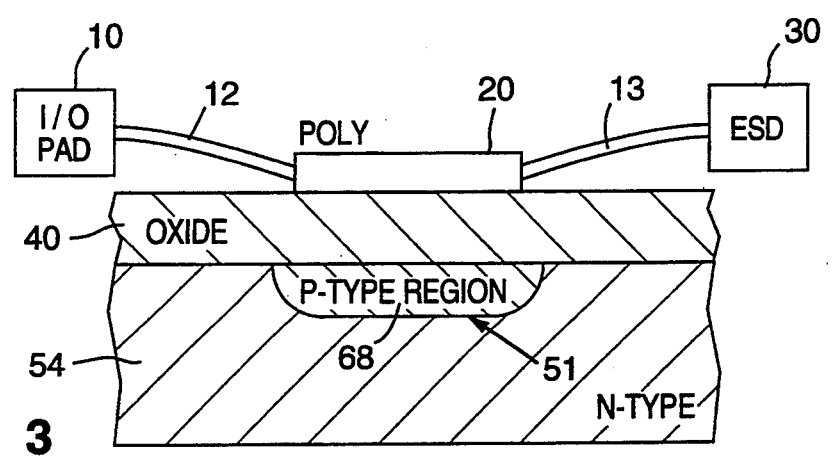
FIG. 3 is a cross-sectional view of an embodiment of the invention with an n-type substrate, and a p-type well formed in the n-type substrate.

FIG. 3 shows an embodiment of the invention in which substrate 54 is made of n-type semiconductor material, and well 68 is made of p-type semiconductor material. Poly resistor 20 is connected to the I/O pad 10 and ESD protection device 30 by wires 12 and 13, as in FIG. 2 above. The well 68 is positioned beneath the resistor 20 and is separated from the resistor 20 by the metal oxide 40.

The well 68 may be connected to a fixed potential, or allowed to float. Well 68 may be composed of any p-type material, and specifically, it may or may not have p-type field implantation.

Figure 4:
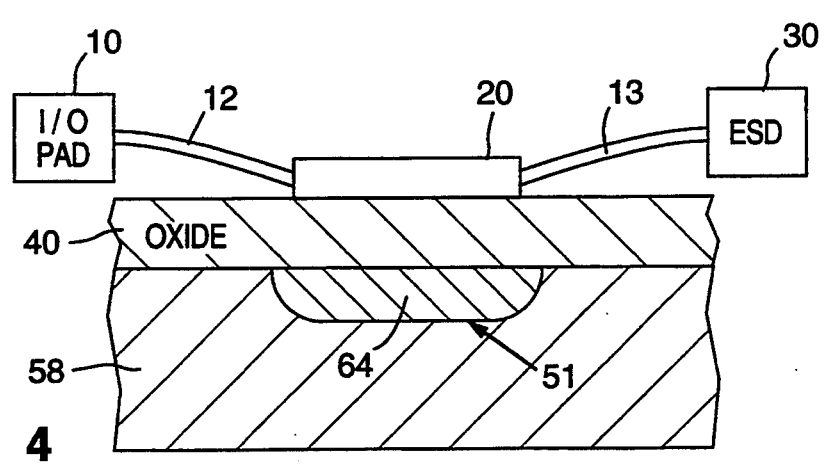
FIG. 4 is a cross-sectional view of an embodiment of the invention incorporating an n-type well and a p-type substrate.

FIG. 4 shows an embodiment incorporating an n-type well 64 with a p-type substrate 58. The poly resistor 20 is connected to the I/O pad 10 and the ESD protection device 30 by wires 12 and 13. Here again, the well 64 is kept at a fixed potential or is allowed to float. The well 64 may be made of any n-type semiconductor material.

Figure 5:
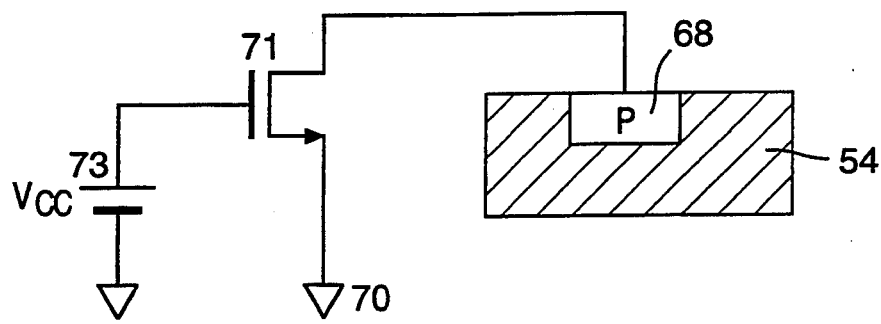
FIG. 5 is a diagram of a preferred embodiment of the invention. Here a p-type well is connected to ground through an NMOS transistor. The gate of the NMOS transistor is tied to a fixed potential which may be any convenient fixed potential.
Figure 6:
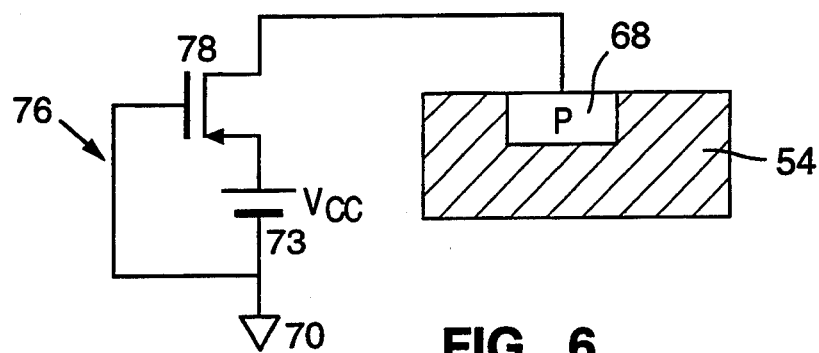
FIG. 6 is a diagram of an alternate preferred embodiment, in which a p-type well is connected to a fixed potential through a PMOS transistor.

Preferred embodiments of the invention are shown in FIGS. 5 and 6 for p-type wells 68. In FIG. 5, the p-type well region 68 is connected to ground 70 through an NMOS transistor 71. The NMOS transistor 71 has its gate tied to a fixed potential $V_{cc}$ 73. $V_{cc}$ is used as this the external power supply to the chip. When this fixed potential 73 is positive, current flows through the NMOS 71, and the p-type well 68 is held at a fixed potential. However, when the potential 73 is zero, transistor 71 is switched off, so that p-type well 68 floats.

In FIG. 6, the p-type well 68 is connected to $V_{cc}$ 73 through a PMOS transistor 78. The gate 76 of PMOS transistor 78, in turn, is connected to ground 70. When $V_{cc}$ 73 is positive with respect to ground 70, the p-type well 68 is held at a fixed potential. When the potential 73 is off, transistor 78 is switched off, so that p-type well 68 floats.

Each of the embodiments of FIGS. 5 and 6 results in maximal protection for the oxide layer adjacent the well 68. During normal operation of the chip, the well 68 is kept at a fixed potential (to reduce noise). Since the preferred embodiments use an external power supply to drive the MOS transistor employed, the well is fixed by $V_{cc}$ 73 during normal operation of the chip. However, when the chip is stressed during ESD testing or during handling, the MOS transistor is switched off, and well 68 floats.

Figure 7:
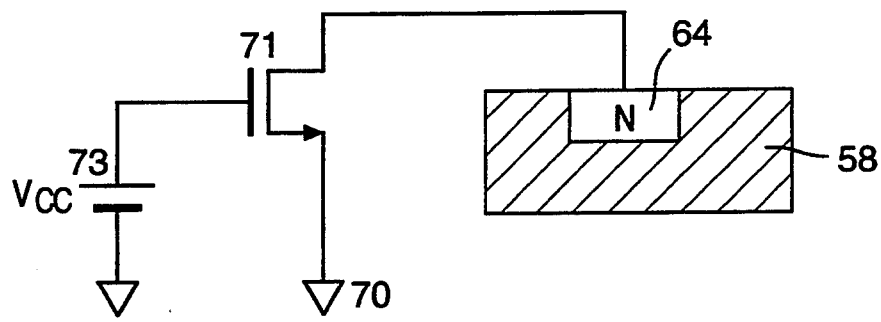
FIG. 7 represents a variation on the circuit of FIG. 5 with a well formed of n-type material.
Figure 8:
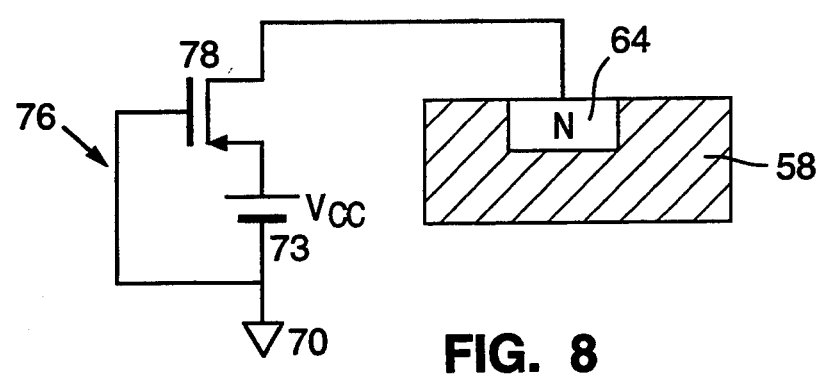
FIG. 8 represents a variation on the circuit of FIG. 6, with a p-type substrate and an n-type well.

FIG. 7 is a variation on the embodiment of FIG. 5 in which the substrate well 64 is made of n-type material and the substrate 58 is made of p-type material. FIG. 8 is a variation on the circuit of FIG. 6 with an n-type well 64 and a p-type substrate 58.

Each of the embodiments of FIGS. 7 and 8, too, results in maximal protection for the oxide layer adjacent the well 64. During normal operation of the chip, the well 64 is kept at a fixed potential (to reduce noise). Since the preferred embodiments use an external power supply to drive the MOS transistor employed, the well is fixed by voltage $V_{cc}$ during normal operation of the chip. However, when the chip is stressed during ESD testing or during handling, the MOS transistor is switched off, and well 64 floats.

Various modifications and alterations in the described apparatus and method of the invention will be apparent to those skilled in the art without departing from the scope and spirit of this invention. Although the invention has been described in connection with specific preferred embodiments, is should be understood that the invention as claimed should not be unduly limited to such specific embodiments.

What is claimed is:

1. An integrated circuit, comprising:
   a semiconductor substrate;
   a metal oxide layer on the substrate; a polysilicon resistor on a first region of the metal oxide layer; and
   an electrostatic discharge protection means comprising a well positioned between said substrate and the first region of the metal oxide layer so as to define a boundary between said well and the substrate, wherein the well establishes a p-n junction at said boundary, and a switch connected to the well such that the well is held at a fixed potential when the switch is closed, and the well floats free when the switch is open.

2. The circuit of claim 1, further comprising: an input-output pad connected to one portion of the polysilicon resistor; and
   an electrostatic discharge protection network connected to another portion of the poly resistor.

3. The circuit of claim 2, wherein the substrate is an n-type semiconductor.

4. The circuit of claim 2, wherein said substrate is a p-type semiconductor.

5. In an integrated circuit having an n-type semiconductor substrate, a metal oxide layer on the substrate, a polysilicon resistor on a first region of said metal oxide layer, an input-output pad connected to said resistor, and an electrostatic protection device connected to said resistor, an improved electrostatic discharge protection means comprising:
   a p-type semiconductor well formed between the metal oxide layer and the substrate adjacent the first region of the metal oxide layer, wherein the well forms a p-n junction with said substrate; and a switch connected to the p-type well such that the p-type well is held at a fixed potential when the switch is in a first state, and the p-type well floats free when the switch is in a second state.

6. The circuit of claim 5, wherein said switch is an MOS transistor, said MOS transistor having a gate which receives an externally generated voltage.

7. The circuit of claim 5, wherein said switch is an MOS transistor, said MOS transistor having a gate connected to a ground potential.

8. The circuit of claim 5, wherein the switch is a transistor connected between the p-type well and ground.

9. In an integrated circuit having a p-type semiconductor substrate, a metal oxide layer on said substrate, a polysilicon resistor on a first region of said metal oxide layer, an input-output pad connected to said resistor, and an electrostatic discharge protection device connected to said resistor, an improved electrostatic discharge protection means comprising:

an n-type semiconductor well formed between the metal oxide layer and the substrate adjacent the first region of the metal oxide layer, wherein the well forms a p-n junction with said substrate; and a switch connected to the n-type well such that the n-type well is held at a fixed potential when the switch is in a first state, and the n-type well floats free when the switch is in a second state.

10. The circuit of claim 9, wherein said switch is an MOS transistor, and wherein the n-type well is connected to ground through said MOS transistor, said MOS transistor having a gate which receives an externally generated potential.

11. The circuit of claim 9, wherein said switch is an MOS transistor, and wherein the n-type well is connected to an external power supply means through said MOS transistor, said MOS transistor having a gate connected to a ground potential.

12. The circuit of claim 9, wherein the switch is connected between the n-type well and ground, for holding the n-type well at a fixed potential when the switch is closed and for letting the n-type well float free when the switch is open.

* * * * *